(12) United States Patent
Pelley et al.

(10) Patent No.: US 8,836,371 B2
(45) Date of Patent: Sep. 16, 2014

(54) SYSTEMS AND METHODS FOR REDUCED COUPLING BETWEEN DIGITAL SIGNAL LINES

(71) Applicants: Perry H. Pelley, Austin, TX (US); James D. Burnett, Austin, TX (US)

(72) Inventors: Perry H. Pelley, Austin, TX (US); James D. Burnett, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 67 days.

(21) Appl. No.: 13/746,840

(22) Filed: Jan. 22, 2013

(65) Prior Publication Data
US 2014/0203841 A1    Jul. 24, 2014

(51) Int. Cl.
*H03K 19/096* (2006.01)
*H03K 3/286* (2006.01)

(52) U.S. Cl.
CPC ................................. *H03K 19/096* (2013.01)
USPC .................................. 326/93; 326/97; 326/95

(58) Field of Classification Search
None
See application file for complete search history.

(56) References Cited

U.S. PATENT DOCUMENTS

| 6,133,759 | A  | * | 10/2000 | Beck et al. ...................... 326/98 |
| 7,173,456 | B2 | * | 2/2007  | Lundberg ........................ 326/97 |
| 7,482,840 | B2 | * | 1/2009  | Masuo et al. ................... 326/97 |
| 2005/0046446 | A1 | * | 3/2005 | Qureshi et al. ................. 326/95 |

OTHER PUBLICATIONS

Lin, "Low Power Bus Encoding Technique Considering Coupling Effects", Proceedings of the International Multiconference of Engineers and Computer Scientists 2007, Mar. 21-23 2007, 22 pgs.
Lin, "Low Power Bus Encoding Technique Considering Coupling Effects", Proceedings of the International Multiconference of Engineers and Computer Scientists 2007, Mar. 21-23, 2007, 4 pgs.

* cited by examiner

*Primary Examiner* — Crystal L Hammond
(74) *Attorney, Agent, or Firm* — Egan, Peterman, Enders LLP.

(57) ABSTRACT

Methods and systems are disclosed for reduced coupling between digital signal lines. For disclosed embodiments, return-to-zero signaling is dynamically blocked so that high logic levels remain high through entire clock cycles where the next data to be output is also at high logic levels. The dynamically blocked return-to-zero signaling reduces capacitive coupling between digital signal lines, such as clock and data signal lines, that are in close proximity to each other by reducing current flow that would otherwise occur with return-to-zero signaling. The dynamically blocked return-to-zero signaling can be used in a wide variety of environments and implementations.

20 Claims, 4 Drawing Sheets

US 8,836,371 B2

SYSTEMS AND METHODS FOR REDUCED COUPLING BETWEEN DIGITAL SIGNAL LINES

TECHNICAL FIELD

This technical field relates to digital output circuitry and, more particularly, to techniques for improving performance of digital signaling.

BACKGROUND

Integrated circuits and other electronic systems often include signal lines that carry digital signals that transition between logic high voltage levels and logic low voltage levels. Undesirable capacitive coupling can develop between such digital signal lines if they are in close proximity to each other within the integrated circuit or electronic system.

FIG. 1 (prior art) is an embodiment 100 of a block diagram for digital signal lines, for example, within an integrated circuit. Embodiment 100 represents a cross-section of an integrated circuit with the surface of the integrated circuit being parallel with signal lines 102 and 104. Signal lines 102 and 104 represent digital signal lines that flow in one direction across the integrated circuit. Elements 106, 108, 110, 112, and 114 represent digital signal lines that are running perpendicular to signal lines 102 and 104 within the integrated circuit. During operation, capacitive coupling can occur between these digital signal lines, particularly, if they are changing voltage levels in close proximity to each other. For example, this can occur when one signal line is carrying a clock signal and another signal line is carrying a data output signal. The capacitor symbols shown between adjacent digital signal lines 102, 104, 106, 108, 110, 112, and 114 in embodiment 100 represent parasitic capacitances that can be created by this capacitive coupling between digital signal lines. This parasitic capacitance is often undesirable and can reduce the performance of digital signaling within an integrated circuit and/or electronic system that includes the digital signal lines.

Return-to-zero signaling, as described below with respect to FIG. 2 (Prior Art) and FIG. 3 (Prior Art), has been used to reduce capacitive coupling by keeping voltage levels for clock or a first data signals from moving in one direction while voltage levels for an adjacent second data signals move in an opposite direction.

FIG. 2 (prior art) is a block diagram of an embodiment 200 for return-to-zero signaling circuitry that can be used to reduce capacitive coupling. As depicted, a data register 204 receives input data 201 and a clock signal (CLK) 202. The data register 204 then outputs data 206 based upon a clock edge for the clock signal (CLK) 202, such as a rising clock edge. Return-to-zero circuitry 208 receives the data 206 and the clock signal (CLK) 202, and the return-to-zero circuitry 208 outputs return-to-zero (RTZ) data 210. In particular, if data 206 is at a low logic level for a clock cycle, the return-to-zero circuitry 208 outputs a low logic level for the RTZ data 210 throughout the full clock cycle. However, if the data 206 is at a high logic level for a clock cycle, the return-to-zero circuitry 208 outputs a high logic level for the RTZ data 210 during a first portion of the clock cycle but then returns the RTZ data 210 to a low logic level during a second portion of the clock cycle before the end of the clock cycle.

FIG. 3 (prior art) is an embodiment 300 of a timing diagram for return-to-zero signaling. The y-axis represents logic levels for the clock signal (CLK) 202, data 206, and RTZ data 210. The x-axis represents time. Ten clock cycles are indicated from clock cycle T0 to clock cycle T9. Clock cycle T10 is started, but the complete cycle is not shown. The logic levels for the data 206 for these ten clock cycles (T0-T1-T2-T3-T4-T5-T6-T7-T8-T9) are 0-1-1-0-1-0-1-1-1-0, respectively. High logic levels are indicated as a logic "1," and low logic levels are indicated as a logic "0." While the logic levels for data 206 are indicated for each clock cycle, the logic levels for the RTZ data 210 are indicated for each half-cycle. For the embodiment 300, the clock cycle begins at each rising edge of the clock signal (CLK) 202, and the return-to-zero is configured to occur on the falling edge for the clock signal (CLK) 202. Thus, each time the logic level for the data 206 is a high logic level, the RTZ data 210 will return to zero (e.g., low logic level) for the last half-cycle on the falling edge of the clock signal (CLK) 202, as indicated by arrows 302, 304, 306, 308, 310, and 312. Thus, the logic levels for the RTZ data 210 for each half-cycle of the ten clock cycles (T0-T1-T2-T3-T4-T5-T6-T7-T8-T9) are 00-10-10-00-10-00-10-10-10-00, respectively. As depicted, the logic level for the RTZ data 210 stays low for both half-cycles when the data 206 is at a low logic level (e.g., cycles T0, T3, T5, T9). The logic level for the RTZ data 210 is high for the first half-cycle and returns to zero for the second half-cycle when the data 206 is at a high logic level (e.g., cycles T1, T2, T4, T6, T7, T8).

As indicated above, the return-to-zero signaling reduces capacitive coupling between clock and data signal lines by keeping the clock signal from moving in one direction while an adjacent data signal is moving in an opposite direction. In particular, because the RTZ data 210 has always transitioned to a low logic level by the next clock cycle, the clock signal (CLK) 202 and the RTZ data 210 are kept from moving in opposite directions at the same time.

DESCRIPTION OF THE DRAWINGS

It is noted that the appended figures illustrate only example embodiments and are, therefore, not to be considered as limiting the scope of the present invention. Elements in the figures are illustrated for simplicity and clarity and have not necessarily been drawn to scale FIG. 1 (Prior Art) is a block diagram of an embodiment for digital signal lines.

DETAILED DESCRIPTION

Methods and systems are disclosed for reduced coupling between digital signal lines. As described herein, return-tozero signaling is dynamically blocked so that high logic levels remain high through entire clock cycles where the next data to be output is also at high logic levels. The dynamically blocked return-to-zero signaling described herein reduces capacitive coupling between clock and data signal lines in close proximity to each other by reducing current flow that would otherwise occur with return-to-zero signaling. The dynamically blocked return-to-zero signaling can be used in a wide variety of environments and implementations. Different features and variations can be implemented, as desired, and related or modified systems and methods can be utilized, as well.

While return-to-zero signaling reduces capacitive coupling between clock or a first data and an adjacent second data signal lines by keeping the clock or first data signal and the second data signal from moving in opposite directions at the same time, the return-to-zero signaling still requires current flow for each return-to-zero of the signal line. In contrast, for the embodiments described herein, return-to-zero signaling is blocked when the current data being output and the next data to be output are both at high logic levels. As such, the output data stays at a high logic level throughout the current clock cycle and into the next clock cycle without dropping down to a low logic level. This high logic level continues until the next data to be output becomes a low logic level. At that point, the return-to-zero signaling is no longer blocked, and the current data output signal level will be allowed to drop from a high logic level to a low logic level within the clock cycle, as is done in typical return-to-zero signaling. Advantageously, the dynamically blocked return-to-zero signaling described herein reduces coupling between signal lines by blocking return-to-zero voltage level transitions when multiple high logic level data signals are being output. It is further noted that while the embodiments described primarily describe a single stream of two or more bits that are being stored and output in sequence, this single bit stream may be associated with a plurality of bit streams that are being output together in sequence. For example, a serial interface having a single-bit output stream can utilize the output circuitry described herein. Further, a parallel interface, which effectively includes has a plurality of single-bit output streams that are output in parallel with each other, can also utilize the output circuitry described herein. For example, each output stream can utilize the output circuitry described herein. Other variations could also be implemented, as desired.

Figure 1:
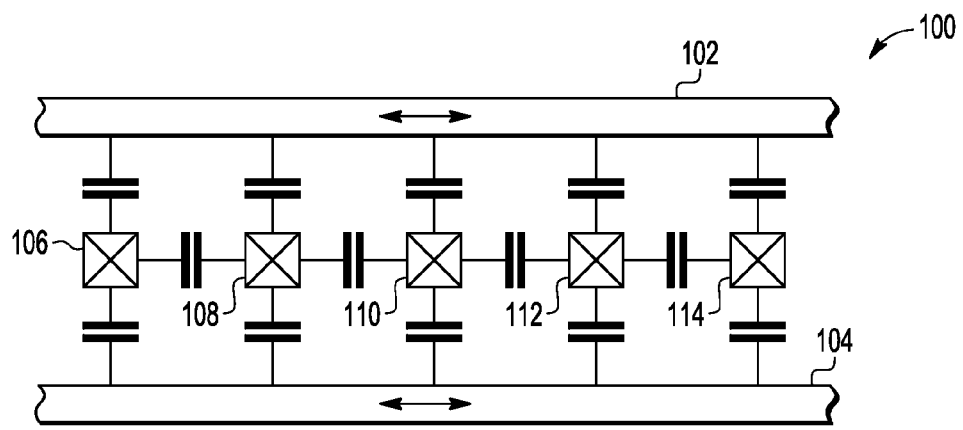
Figure 2:
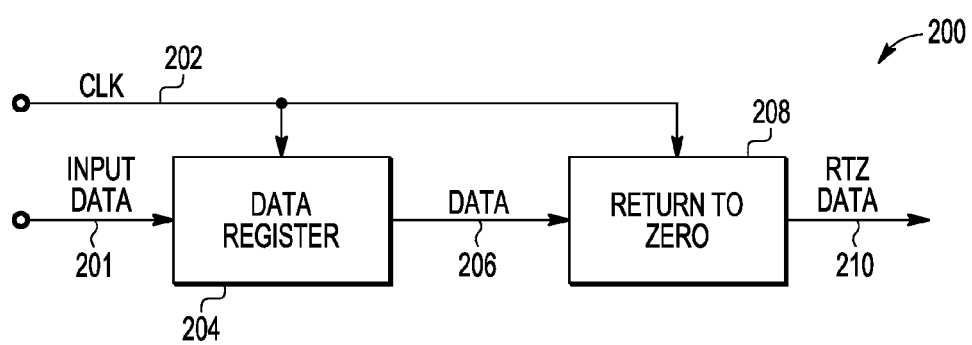
FIG. 2 (Prior Art) is a block diagram of an embodiment for return-to-zero signaling circuitry.
Figure 3:
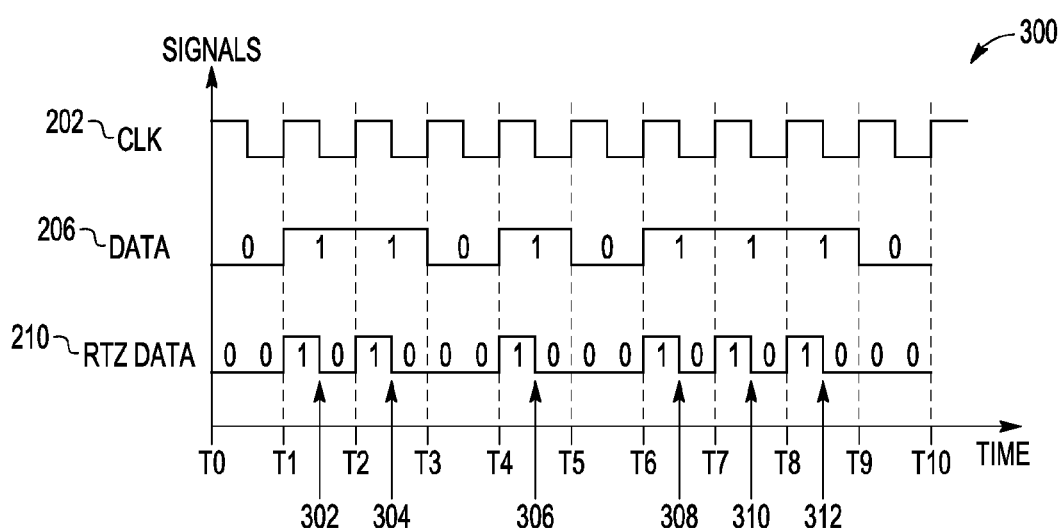
FIG. 3 (Prior Art) is an embodiment of a timing diagram for return-to-zero signaling associated with the circuitry of FIG. 2 (Prior Art).
Figure 4:
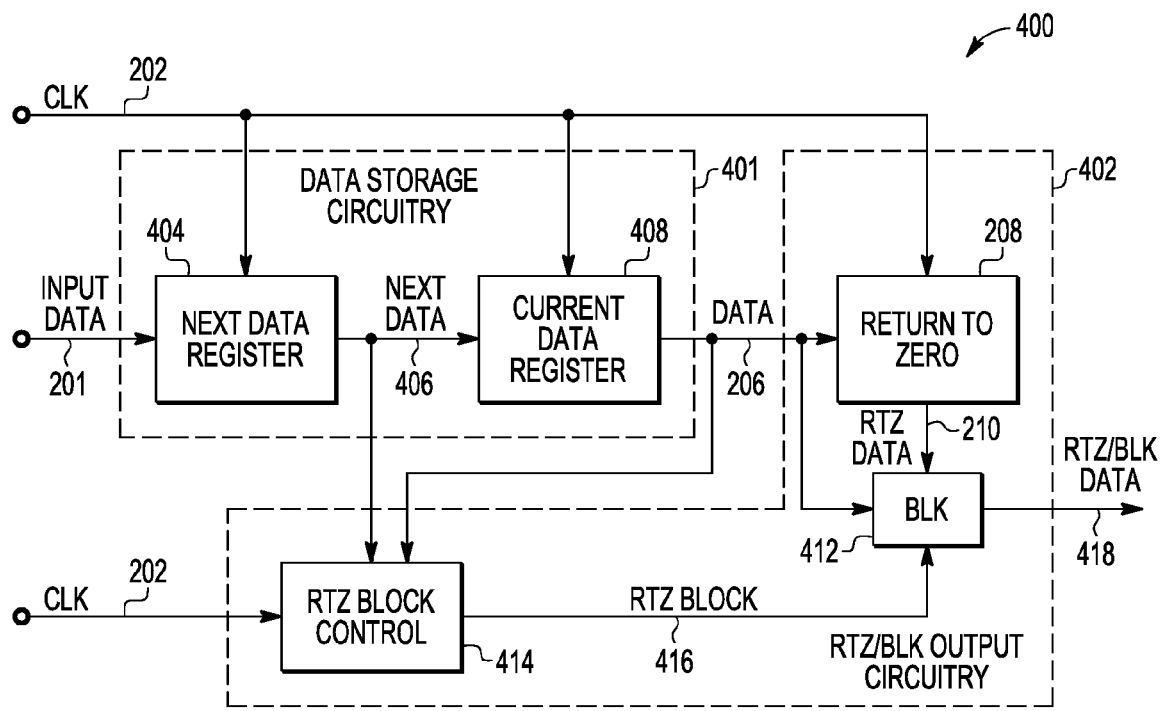
FIG. 4 is a block diagram of an embodiment for circuitry that blocks return-to-zero signaling for data output signals when multiple high logic levels are being output.

FIG. 4 is a block diagram of an embodiment 400 for circuitry that blocks return-to-zero signaling when multiple high logic level data signals are being output in sequence. For the embodiment 400 depicted, data storage circuitry 401 includes a next data register 401 and a current data register 408. The next data register receives input data 201 and provides next data 406 to the current data register 408 based upon clock signal (CLK) 202. The current data register 408 then outputs data 206 to return-to-zero (RTZ) circuitry 208 based upon the clock signal (CLK) 202. The RTZ circuitry 208 then provides RTZ data 210 to block (BLK) circuitry 412. The next data 406 and the current data 206 are also provided to return-to-zero (RTZ) block control circuitry 414, along with clock signal (CLK) 202. When the data 206 is at a low logic level, the RTZ block control circuitry 414 is configured to de-assert that RTZ block signal 416. When the data 206 is at a high logic level, the RTZ block control circuitry 414 is configured to determine if the next data 406 is also at a high logic level. If so, the RTZ block control circuitry 414 asserts the RTZ block signal 416 to block (BLK) circuitry 412. The block (BLK) circuitry 412 then operates to block the RTZ circuitry 208 from providing return-to-zero (RTZ) signaling until the RTZ block signal 416 is de-asserted. If the next data 406 is at a low logic level, then the RTZ block control circuitry 414 de-asserts the RTZ block signal 416. When the RTZ block signal 416 is de-asserted, the block (BLK) circuitry 412 allows the RTZ circuitry 208 to provide return-to-zero signaling. Thus, the dynamically blocked return-to-zero (RTZ/BLK) data 418 output by the block (BLK) circuitry 412 is different from RTZ data 210 in FIG. 2 (Prior Art) described above. It is noted that for embodiment 400, the dynamically blocked return-to-zero (RTZ/BLK) output circuitry 402 includes the RTZ block control circuitry 414, the return-to-zero circuitry 208, and the block (BLK) circuitry 412. It is further noted that the block (BLK) circuitry 412 could also receive the clock signal (CLK) 202, if desired.

It is noted that return-to-zero signaling circuitry 412 can be implemented, for example, as logic circuitry that provides a data output that matches the data input upon each rising edge of a clock signal and that drives the data output to ground upon each a falling edge of a clock signal. The block (BLK) circuitry 416 can be implemented, for example, using multiplexer and logic circuitry that chooses data 206 as an output when the RTZ block signal 416 is asserted and chooses the RTZ data 210 when the RTZ block signal 416 is de-asserted. Further, the RTZ block control circuitry 414 can be implemented, for example, as logic circuitry that applies the RTZ block signal 416 according to the logic table provided in TABLE 1 below for the logic levels for the next data 406 and the current data 206. It is noted that for this logic table, when either the next data 406 or the current data 206 is at a low logic level, the RTZ block signal 416 is de-asserted. Thus, in one implementation, the RTZ block control circuitry 414 can be configured to look at the next data 406 only if the current data 206 is a high logic level. In another implementation, the RTZ block control circuitry 414 could be configured to look at the current data 206 only if the next data 206 is a high logic level. Other implementations could also be utilized if desired.

TABLE 1

EXAMPLE LOGIC TABLE

| Current Data 206 | Next Data 406 | Action for RTZ block signal 416 |
|---|---|---|
| 1 | 1 | Assert |
| 1 | 0 | De-Assert |
| 0 | 1 | De-Assert |
| 0 | 0 | De-Assert |

Figure 5:
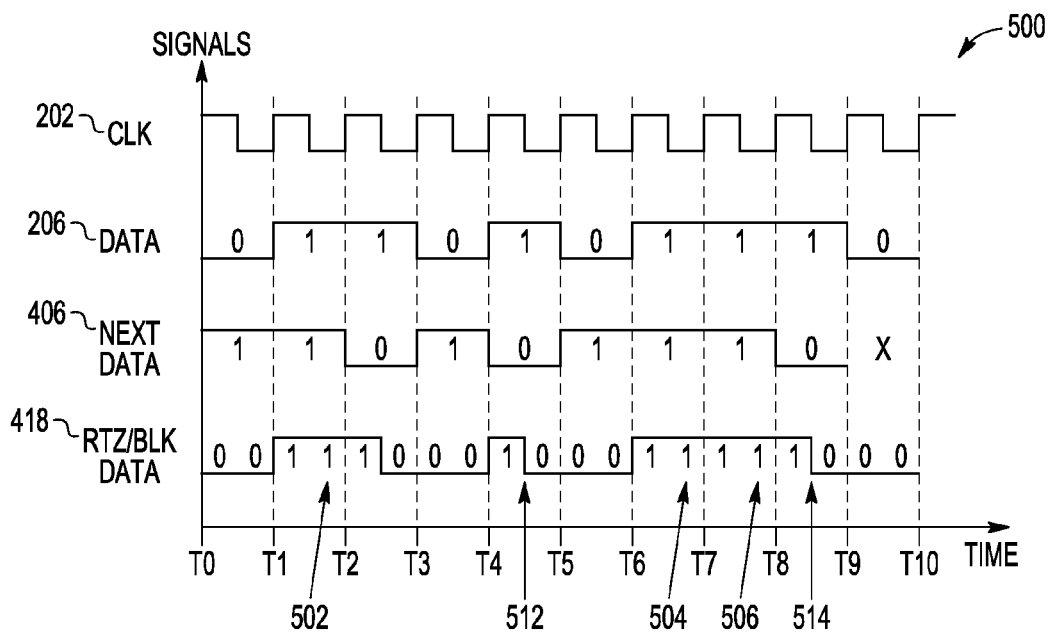
FIG. 5 is an embodiment of a timing diagram for dynamically blocked return-to-zero signaling associated with the example embodiment of FIG. 4.

FIG. 5 is an embodiment 500 of timing diagram for dynamically blocked return-to-zero signaling associated with the example embodiment 400 of FIG. 4. The y-axis represents logic levels for the clock signal (CLK) 202, current data 206, next data 406, and RTZ/BLK data 418. The x-axis represents time. Ten clock cycles are indicated from clock cycle T0 to clock cycle T9. Clock cycle T10 is started, but the complete cycle is not shown. The logic levels for the data 206 for the ten clock cycles (T0-T1-T2-T3-T4-T5-T6-T7-T8-T9) are 0-1-1-0-1-0-1-1-1-0, respectively. The logic levels for the next data 406 for these ten clock cycles leads the logic levels for the data 206 by one cycle and are 1-1-0-1-0-1-1-1-0-X, respectively. The "X" is used for cycle T9 because the logic level for data 206 in cycle T10 is not shown. High logic levels are indicated as a logic "1," and low logic levels are indicated as a logic "0." While the logic levels for data 206 are indicated for each clock cycle, the logic levels for the RTZ/BLK data 418 are indicated for each half-cycle. For the embodiment 500, the clock cycle begins at each rising edge of the clock signal (CLK) 202.

According to the dynamically blocked RTZ signaling described herein, each time the logic level for the data 206 is at a high logic level and the next data 406 is also at a high logic level, RTZ signaling is blocked by assertion of the RTZ block signal 416. As such, RTZ/BLK data 418 will stay at a high logic level and not return to zero for the last half-cycle, as indicated by arrows 502, 504, and 506. Each time the logic level for the data 206 is at a high logic level and the next data 406 is at a low logic level, RTZ signaling is allowed to occur by de-assertion of the RTZ block signal 416. As such, the RTZ/BLK data 418 will return to zero (e.g., low logic level) for the last half-cycle on the falling edge of the clock signal (CLK) 202, as indicated by arrows 512 and 514. If the data 206 is at a low logic level, then the RTZ/BLK data 418 will also be at a low logic level. Thus, the logic levels for the RTZ/BLK data 418 for the ten clock cycles (T0-T1-T2-T3-T4-T5-T6-T7-T8-T9) are 00-11-10-00-10-00-11-11-10-00, respectively. The logic level for the RTZ/BLK data 418, therefore, stays low for both half-cycles when the data 206 is at a low logic level. The logic level for the RTZ/BLK data 418 stays high for both half-cycles when the data 206 is at a high logic level and the next data 406 is also at a high logic level. The logic level for the RTZ/BLK data 418 is high for the first half-cycle and returns to zero for the second half-cycle when the data 206 is at a high logic level and the next data 406 is at a low logic level.

As indicated above, the dynamically blocked return-to-zero signaling described herein reduces capacitive coupling by reducing current flow generated by return-to-zero signaling when multiple high logic levels are being output in a sequence. In particular, because the RTZ/BLK data 418 remains at a high logic level until the next data 406 is at a low logic level, the RTZ/BLK data 428 is kept from moving to a low logic level and then back to a high logic level while the next data 406 stays at a high logic level. This blocking of return-to-zero signaling, therefore, reduces current flows, thereby reducing undesirable coupling between digital signal lines.

Figure 6:
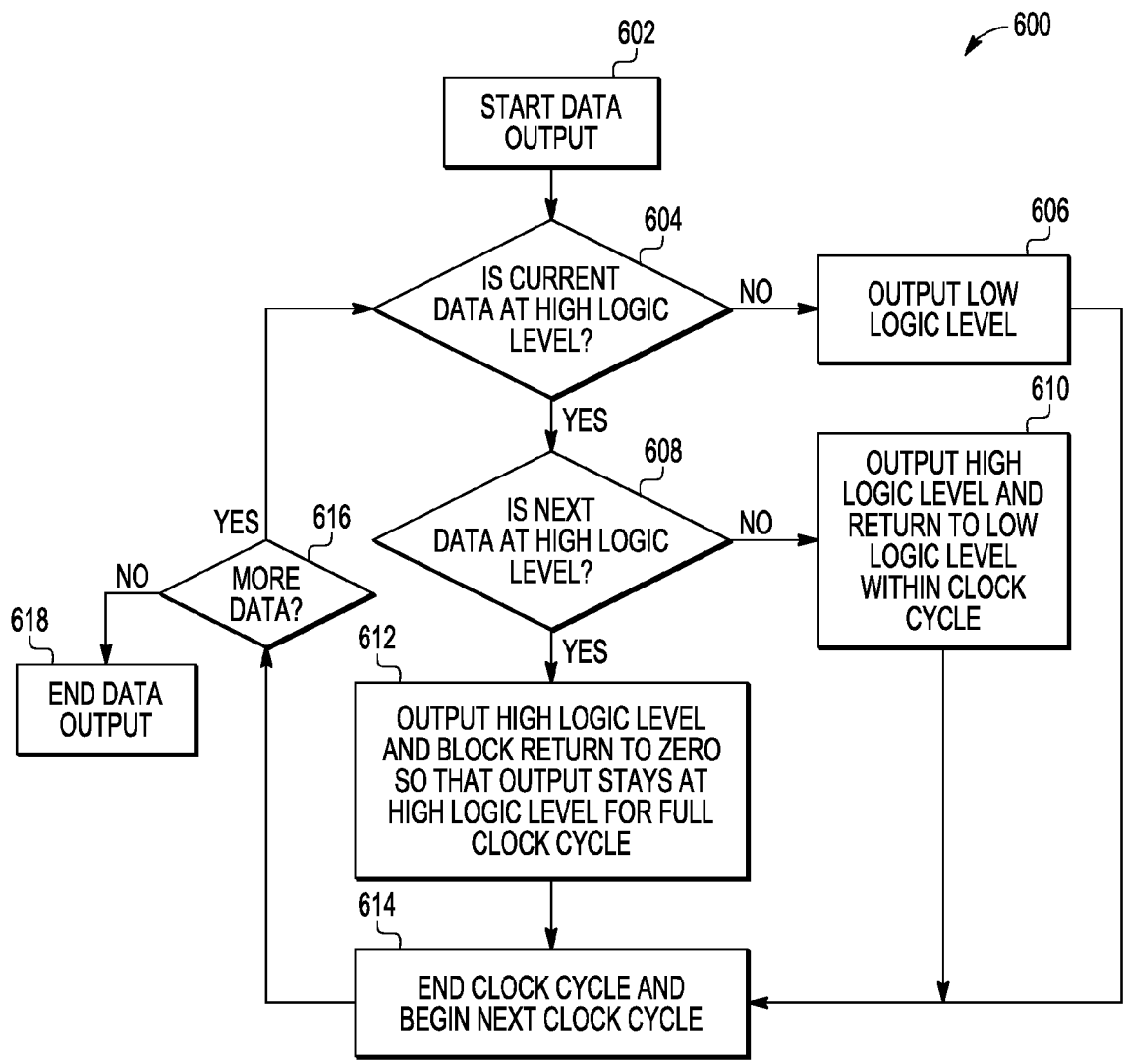
FIG. 6 is an embodiment of a process diagram for dynamically blocked return-to-zero signaling.

FIG. 6 is an embodiment 600 of a process diagram for dynamically blocked return-to-zero signaling. In block 602, data output is started. In determination block 604, a determination is made whether the current data being output is at a high logic level. If the determination in block 604 is "NO," then flow passes to block 606 where a low logic level is output for the data. Flow then passes to block 614. If the determination in block 604 is "YES," then flow passes to determination block 608 where a determination is made whether the next data to be output is at a high logic level. If the determination in block 608 is "NO," then flow passes to block 610 where a high logic level is first output for the data and where the data output is then returned to a low logic level within the clock cycle to provide return-to-zero signaling. Flow then passes to block 614. If the determination in block 608 is "YES," then flow passes to block 612 where a high logic level is output for the data and where return-to-zero signaling is blocked so that the data output stays at a high logic level for the clock cycle. Thus, return-to-zero signaling is dynamically blocked when the current data and the next data are both at a high logic level. Flow then passes to block 614. In block 614, the clock cycle ends, and the next clock cycle begins. Flow then passes to determination block 616 where a determination is made whether there is more data to output. If "YES," then flow passes back to determination block 604. If "NO," then flow passes to block 618 where data output is ended.

Figure 7:
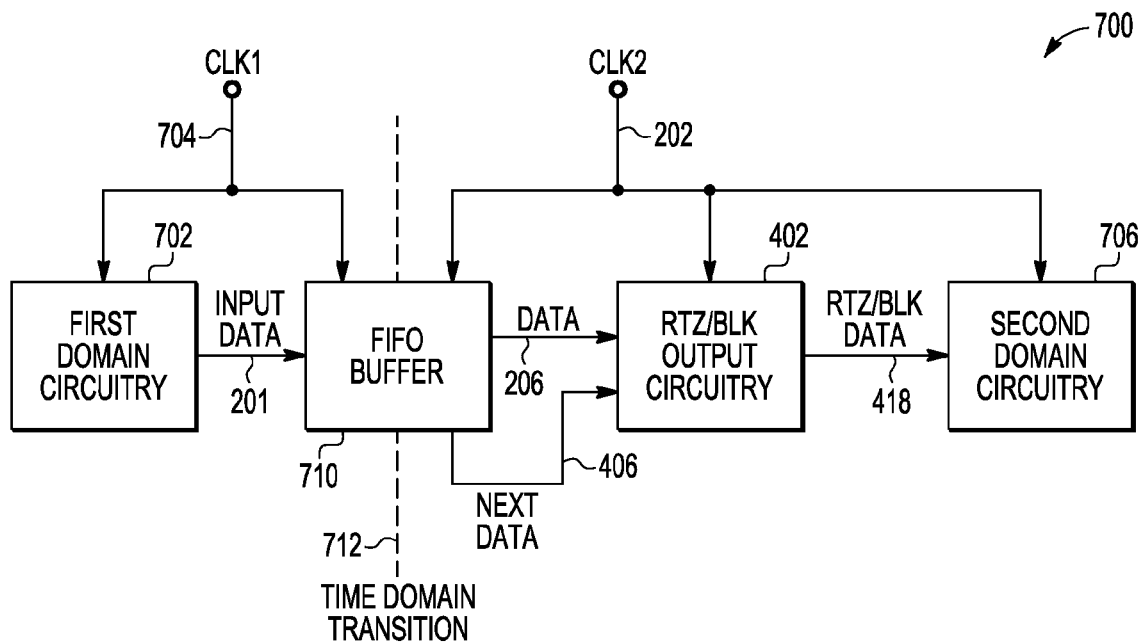
FIG. 7 is a block diagram of an embodiment for applying dynamically blocked return-to-zero signaling to circuitry that provides digital communication between different time domains.
Figure 8:
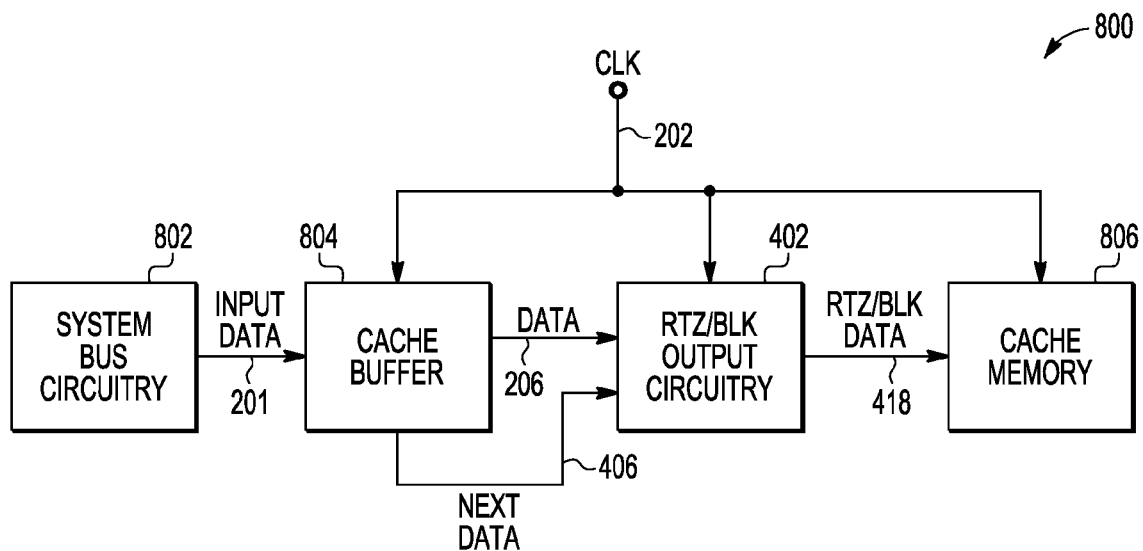
FIG. 8 is a block diagram of an embodiment for applying dynamically blocked return-to-zero signal to circuitry that provides digital communication to a cache buffer.

It is noted that the high logic levels and the low logic levels described herein, which are also indicated as logic "1s" and logic "0s," represent sequences of data bits that are being output by the digital systems described herein based upon a clock signal having a plurality of clock cycles. It is further noted that the dynamically blocked return-to-zero signaling described herein can be applied to a variety of environments where clock signals and digital data signals are being generated in close proximity to each other within an integrated circuit and/or electronic system. As described above, the dynamically blocked return-to-zero signaling uses knowledge of current logic levels and next logic levels for digital data to determine whether or not to block return-to-zero signaling. Because current data and next data is utilized, the dynamically blocked return-to-zero signaling can be readily used in environments where multiple bits of data are stored and output using a clock signal. FIG. 7 and FIG. 8 provide example embodiments for such environments. However, it is noted that the dynamically blocked return-to-zero signaling described herein could be used in other environments, as well.

FIG. 7 is a block diagram of an embodiment 700 for applying dynamically blocked return-to-zero signaling to circuitry that provides digital communication between different time domains. For the embodiment depicted, the dashed line 712 through FIFO (first-in-first-out) buffer 710 represents a time domain transition between first time domain driven by a first clock signal (CLK1) 704 and a second time domain driven by a second clock signal (CLK2) 202. First domain circuitry 702 receives the first clock signal (CLK1) 704 and outputs input data 201 to FIFO buffer 710 based upon the first clock signal (CLK1) 704. FIFO buffer 710 receives the input data 201 and the first clock signal (CLK1) 704, and the FIFO buffer 710 outputs data 206 based upon the second clock signal (CLK2) 202. The RTZ/BLK output circuitry 402 receives current data 206 and next data 406 from the FIFO buffer 710 and receives the second clock signal (CLK2) 202. The RTZ/BLK output circuitry 402 then outputs RTZ/BLK data 418 based upon the second clock signal (CLK2) 202, as described above with respect to FIG. 5. The second domain circuitry 706 then receives the RTZ/BLK data 418 and the second clock signal (CLK2) 202.

FIG. 8 is a block diagram of an embodiment 800 for applying dynamically blocked return-to-zero signal to circuitry that provides digital communication to a cache buffer. For the embodiment depicted, a cache buffer 804 receives input data 201 from system bus circuitry 802. Cache buffer 804 also receives a clock signal (CLK) 202 and outputs data 206 based upon the clock signal (CLK) 202 to the RTZ/BLK output circuitry 402. The RTZ/BLK output circuitry 402 receives the current data 206 and next data 406 from the cache buffer 804 and receives the clock signal (CLK) 202. The RTZ/BLK output circuitry 402 then outputs RTZ/BLK data 418 based upon the clock signal (CLK) 202, as described above with respect to FIG. 5. The cache memory 806 then receives the RTZ/BLK data 418 on its internal data bus for writing to the cache memory and the clock signal (CLK) 202.

It is again noted that FIGS. 7 and 8 are providing example embodiments, and the dynamically blocked return-to-zero signaling could be used in other implementations, as desired.

As described herein, a variety of embodiments can be implemented and different features and variations can be implemented, as desired.

In one embodiment, a digital data output system is disclosed that includes data storage circuitry configured to store two or more data bits and to output the data bits in sequence based upon a clock signal and that includes output circuitry coupled to receive a current data bit and a next data bit from the data storage circuitry. The output circuitry is configured to output a low logic level for a clock cycle when the current data bit is a low logic level. The output circuitry is further configured to output a high logic level during a first portion of a clock cycle when the current data bit is a high logic level, to maintain the high logic level for the clock cycle if the next data bit is a high logic level, and to transition to a low logic level during the clock cycle if the next data bit is a low logic level.

In further embodiments, the output circuitry is configured to output the high logic level on a first clock edge for the clock cycle and to output the low logic level on a second clock edge for the clock cycle when the current data bit is a high logic level and the next data bit is a low logic level. Still further, the first clock edge can be a rising edge, and the second clock edge can be a falling edge. In other embodiments, the data storage circuitry includes a current data register configured to output the current data bit and a next data register configured to output the next data bit. Further, the output circuitry can be configured to output the high logic level for an entire clock cycle when the current data bit is a high logic level and the next data bit is a high logic level.

Still further, the output circuitry can include return-to-zero circuitry configured to receive current data bits and to output return-to-zero logic levels, and the output circuitry can further include block circuitry configured to selectively output a logic level associated with a current data bit or a return-to-zero logic level based upon a block control signal. In addition, the output circuitry can further include control circuitry configured to receive the current data bit and the next data bit, to assert the block control signal if the current data bit and the next data bit are both at a high logic level, and to de-assert the block control signal if the current data bit or the next data bit is at a low logic level.

In further embodiments, the data storage circuitry can include a buffer configured to receive the two or more data bits at a first clock rate and to output the data bits at a second clock rate, the second clock rate being associated with the clock signal. Further, the buffer can be a first-in-first-out buffer. In addition, the data storage circuitry can be a cache buffer configured to receive the two or more data bits from system bus circuitry and to output the data bits for a cache memory based upon the clock signal.

In one other embodiment, a method for outputting digital data is disclosed that includes storing two or more data bits to be output in sequence based upon a clock signal, and determining a logic level for a current data bit. Further, the method further includes outputting a low logic level for a clock cycle if the current data bit is a low logic level. And the method includes outputting a high logic level for a first portion of a clock cycle if the current data bit is a high logic level, maintaining the high logic level for the clock cycle if the next data bit is a high logic level, and transitioning to a low logic level during the clock cycle if the next data bit is a low logic level. Still further, the determining and outputting steps are repeated for a plurality of clock cycles until the two or more data bits are output.

In further embodiments, the method includes outputting a high logic level on a first clock edge for the clock cycle and a low logic level on a second clock edge for the clock cycle, when the current data bit is a high logic level and the next data bit is a low logic level. Still further, the first clock edge can be a rising edge, and the second clock edge can be a falling edge. In other embodiments, the storing step can include storing the current data bit in a current data register and storing the next data bit in a next data register. Further, the method can further include outputting the high logic level for an entire clock cycle, when the current data bit is a high logic level and the next data bit is a high logic level.

Still further, the outputting steps can include using return-to-zero circuitry to receive current data bits and to output return-to-zero logic levels, and selectively outputting a logic level associated with a current data bit or a return-to-zero logic level based upon a block control signal. In addition, the method can further include asserting the block control signal if the current data bit and the next data bit are both at a logic high level, and de-asserting the block control signal if the current data bit or the next data bit is at a low logic level.

In further embodiments, the storing step can include storing the two or more data bits in a buffer at a first clock rate that is different from a second clock rate associated with the clock signal. Further, the buffer can be a first-in-first-out buffer. In addition, the storing step can include storing the two or more data bits in a cache buffer, the data bits being received from system bus circuitry.

Unless stated otherwise, terms such as "first" and "second" are used to arbitrarily distinguish between the elements such terms describe. Thus, these terms are not necessarily intended to indicate temporal or other prioritization of such elements.

Further modifications and alternative embodiments of the described systems and methods will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although the invention is described herein with reference to specific embodiments, various modifications and changes can be made without departing from the scope of the present invention. Accordingly, the specification and figures are to be regarded in an illustrative rather than a restrictive sense, and such modifications are intended to be included within the scope of the present invention. Further, any benefits, advantages, or solutions to problems that are described herein with regard to specific embodiments are not intended to be construed as a critical, required, or essential feature or element of any or all the claims.

What is claimed is:

1. A digital data output system, comprising:
   data storage circuitry configured to store two or more data bits and to output the data bits in sequence based upon a clock signal; and
   output circuitry coupled to receive a current data bit and a next data bit from the data storage circuitry;
   wherein the output circuitry is configured to output a low logic level for a clock cycle when the current data bit is a low logic level; and
   wherein the output circuitry is further configured to output a high logic level during a first portion of a clock cycle when the current data bit is a high logic level, to maintain the high logic level for the clock cycle if the next data bit is a high logic level, and to transition to a low logic level during the clock cycle if the next data bit is a low logic level.

2. The digital data output system of claim 1, wherein the output circuitry is configured to output the high logic level on a first clock edge for the clock cycle and to output the low logic level on a second clock edge for the clock cycle when the current data bit is a high logic level and the next data bit is a low logic level.

3. The digital data output system of claim 2, wherein the first clock edge is a rising edge and the second clock edge is a falling edge.

4. The digital data output circuitry of claim 1, wherein the data storage circuitry comprises a current data register configured to output the current data bit and a next data register configured to output the next data bit.

5. The digital data output system of claim 1, wherein the output circuitry is configured to output the high logic level for an entire clock cycle when the current data bit is a high logic level and the next data bit is a high logic level.

6. The digital data output system of claim 1, wherein the output circuitry comprises return-to-zero circuitry configured to receive current data bits and to output return-to-zero logic levels, and wherein the output circuitry further comprises block circuitry configured to selectively output a logic level associated with a current data bit or a return-to-zero logic level based upon a block control signal.

7. The digital data output signal of claim 6, wherein the output circuitry further comprises control circuitry configured to receive the current data bit and the next data bit, to assert the block control signal if the current data bit and the next data bit are both at a high logic level, and to de-assert the block control signal if the current data bit or the next data bit is at a low logic level.

8. The digital data output system of claim 1, wherein the data storage circuitry comprises a buffer configured to receive the two or more data bits at a first clock rate and to output the two or more data bits at a second clock rate, the second clock rate being associated with the clock signal.

9. The digital data output system of claim 8, wherein the buffer comprises a first-in-first-out buffer.

10. The digital data output system of claim 1, wherein the data storage circuitry comprises a cache buffer configured to receive the two or more data bits from system bus circuitry and to output the two or more data bits for a cache memory based upon the clock signal.

11. A method for outputting digital data, comprising:
    storing two or more data bits to be output in sequence based upon a clock signal;
    determining a logic level for a current data bit;
    outputting a low logic level for a clock cycle if the current data bit is a low logic level; and
    outputting a high logic level for a first portion of a clock cycle if the current data bit is a high logic level, maintaining the high logic level for the clock cycle if the next data bit is a high logic level, and transitioning to a low logic level during the clock cycle if the next data bit is a low logic level; and
    repeating the determining and outputting steps for a plurality of clock cycles to output the two or more stored data bits in sequence.

12. The method of claim 11, wherein when the current data bit is a high logic level and the next data bit is a low logic level, the method includes outputting a high logic level on a first clock edge for the clock cycle and a low logic level on a second clock edge for the clock cycle.

13. The method of claim 12, wherein the first clock edge is a rising edge and the second clock edge is a falling edge.

14. The method of claim 11, wherein the storing step comprising storing the current data bit in a current data register and storing the next data bit in a next data register.

15. The method of claim 11, wherein when the current data bit is a high logic level and the next data bit is a high logic level, outputting the high logic level for an entire clock cycle.

16. The method of claim 11, wherein the outputting steps comprise using return-to-zero circuitry to receive current data bits and to output return-to-zero logic levels, and selectively outputting a logic level associated with a current data bit or a return-to-zero logic level based upon a block control signal.

17. The method of claim 16, further comprising asserting the block control signal if the current data bit and the next data bit are both at a logic high level, and de-asserting the block control signal if the current data bit or the next data bit is at a low logic level.

18. The method of claim 11, wherein the storing step comprises storing the two or more data bits in a buffer at a first clock rate that is different from a second clock rate associated with the clock signal.

19. The method of claim 11, wherein the buffer comprises a first-in-first-out buffer.

20. The method of claim 11, wherein the storing step comprises storing the two or more data bits in a cache buffer, the two or more data bits being received from system bus circuitry.

* * * * *